United States Patent [19]

Shanklin et al.

[11] Patent Number: 5,057,393
[45] Date of Patent: Oct. 15, 1991

[54] DYE BRANCHED-ALKYL BORATE PHOTOINITIATORS

[75] Inventors: Michael S. Shanklin, Miamisburg; Peter Gottschalk, Centerville, both of Ohio

[73] Assignee: The Mead Corporation, Dayton, Ohio

[21] Appl. No.: 377,671

[22] Filed: Jul. 10, 1989

[51] Int. Cl.$^5$ .............................................. G03C 1/73
[52] U.S. Cl. ................................... 430/138; 430/281; 430/914; 430/915; 522/25; 522/31
[58] Field of Search .............. 430/281, 138, 914, 915; 522/31, 25

[56] References Cited

U.S. PATENT DOCUMENTS

| | | | |
|---|---|---|---|
| 4,772,541 | 9/1988 | Gottschalk et al. | 430/339 |
| 4,865,942 | 9/1989 | Gottschalk et al. | 430/914 |
| 4,902,604 | 2/1990 | Yamaguchi et al. | 430/914 |
| 4,937,161 | 6/1990 | Kita et al. | 430/914 |
| 4,952,480 | 8/1990 | Yamaguchi et al. | 430/914 |

Primary Examiner—Marion E. McCamish
Assistant Examiner—C. D. RoDee
Attorney, Agent, or Firm—Thompson, Hine and Flory

[57] ABSTRACT

The present invention is directed to a compound of the formula (I):

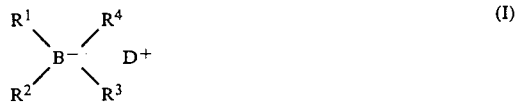

where $D+$ is a cationic dye moiety; $R^1$ is a branched chain alkyl group, and $R^2$, $R^3$ and $R^4$ are independently selected from the group consisting of alkyl, aryl, aralkyl, alkaryl, alkenyl, alkynyl, alicyclic, heterocyclic, and allyl groups.

9 Claims, No Drawings

DYE BRANCHED-ALKYL BORATE PHOTOINITIATORS

BACKGROUND

The present invention relates to a novel class of cationic dye-borate anion complexes which are useful as photoinitiators and to photohardenable compositions and photosensitive materials containing the same.

U.S. Pat. Nos. 4,772,541 and 4,772,530 to The Mead Corporation disclose a novel class of photoinitiators which are compounds consisting of an ionic photoreducible or photooxidizable dye and a counter ion which absorb light and generate a free radical. The preferred photoinitiators are complexes of a cationic dye and a borate anion. While these photoinitiators are suitable for many applications there is a desire to design photoinitiators which provide higher film speeds.

SUMMARY OF THE INVENTION

The present invention provides a novel class of photoinitiators which provide higher film speeds. These photoinitiators are represented by the formula (I)

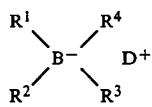

where $D^+$ is a cationic dye, $R^1$ is a branched chain alkyl group and $R^2$, $R^3$ and $R^4$ are independently selected from the group consisting of alkyl, aryl, alkaryl, allyl, aralkyl, alkenyl, alkynyl, alicyclic and saturated or unsaturated heterocyclic groups.

It has been shown that only a small amount of n-alkyl borate radicals in cyanine borate initiated polymerization of acrylates escape the solvent cage to initiate polymerization. Recombination of the borate and cyanine radicals may be a significant factor in the loss of productive radicals. In accordance with the present invention a more sterically hindered radical is provided through a branched chain alkyl group. This radical should be less likely to recombine with the cyanine radical before diffusing from the solvent cage. Consequently, these cyanine borate photoinitiators should provide media with greater photographic speed than previous initiators which use n-butylborate.

Preferably the initiators are represented by the formula (II)

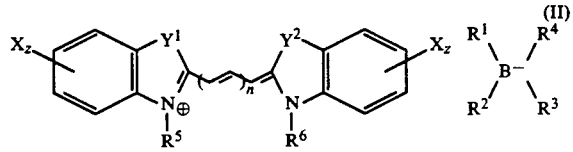

where $Y^1$ and $Y^2$ are the same or different and represent an oxygen atom, a sulfur atom, a selenium atom, a vinyl group, $>C(CH_3)_2$, or $>N$-alkyl and may be the same or different; n is 0, 1, 2, or 3; z is 1 to 4; $R^1$, $R^2$, $R^3$ and $R^4$ are defined as in formula (I); $R^5$ and $R^6$ are alkyl groups and preferably an alkyl group having at least 4 and preferably at least 7 carbon atoms; X is selected based on the desired absorption characteristics of the dye and may be selected from a large number of substituents in a manner known in the art. X may be a hydrogen atom; an electron donating group such as amino, dimethylamino, hydroxy, methoxy, t-butyl, or methyl; or X may be an electron (withdrawing group such as phenyl, fluoro, chloro, bromo, iodo, —COOH, —COOR where R is a lower alkyl group, methycarbonyl, trifluoromethyl, cyano, methylsulfonyl, or nitro.

Accordingly, one manifestation of the present invention is a photoinitiator of the formula (I) and more preferably the formula (II) above.

Another manifestation of the present invention is a photohardenable composition containing a photoinitiator of the formula (I) and more preferably the formula (II).

Still another manifestation of the present invention is a photosensitive material comprising a support having a layer of the aforesaid photohardenable composition on the surface thereof.

Another manifestation of the present invention is a photosensitive material comprising a support having a layer of microcapsules containing the aforesaid photohardenable composition on the surface thereof.

DETAILED DESCRIPTION OF THE INVENTION

Methods useful in making the photoinitiators of the present invention, typical photohardenable compositions, and photosensitive materials are described in U.S. Pat. Nos. 4,772,530 and 4,772,541.

The photoinitiators of the present invention are characterized in that the borate anion includes a branched chain alkyl group and preferably a secondary alkyl group containing 3 to 10 carbon atoms. Still more preferably $R^2$, $R^3$ and $R^4$ represent aryl groups or alkaryl groups such as a phenyl group, an anisyl group, napthyl, etc.

Useful dyes form photoreducible but dark stable complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. The dyes should not contain groups which would neutralize or desensitize the complex or render the complex poorly dark stable.

With respect to the borate anion, useful examples of branched chain alkyl groups are sec-butyl, neopentyl, neohexyl, etc. and are more particularly secondary alkyl groups such as sec-butyl, etc. These alkyl groups may be substituted, for example, by one or more halogen, cyano, acyloxy, acyl, alkoxy or hydroxy groups.

Representative examples of aryl groups represented by $R^2$–$R^4$ include phenyl, naphthyl and substituted aryl groups such as anisyl and alkaryl groups such as methylphenyl, dimethylphenyl, etc. Representative examples of aralkyl groups represented by $R^2$–$R^4$ groups include benzyl and naphthylmethyl. Representative alicyclic groups include cyclobutyl, cyclopentyl, and cyclohexyl groups. Examples of an alkynyl group are propynyl and ethynyl, and examples of alkenyl groups include a vinyl group. Examples of allyl groups include 3,3-diphenyl-2-propenyl, 3,3-dimethyl-2-propenyl, etc.

As a general rule, useful cationic dye-borate anion complexes must be identified empirically, however, potentially useful cationic dye and borate anion combinations can be identified by reference to the Weller equation (Rehm, D. and Weller, A., *Isr. J. Chem.* (1970), 8, 259–271), which can be simplified as follows.

$$\Delta G = E_{ox} - E_{red} - E_{hv} \quad \text{(Eq. 3)}$$

where $\Delta G$ is the change in the Gibbs free energy, $E_{ox}$ is the oxidation potential of the borate anion, $E_{red}$ is the reduction potential of the cationic dye, and $E_{hv}$ is the energy of light used to excite the dye. Useful complexes will have a negative-free energy change. Similarly, the difference between the reduction potential of the dye and the oxidation potential of the borate must be negative for the complex to be dark stable, i.e., $E_{ox} - E_{red} > 0$.

As indicated, Eq. 3 is a simplification and it does not absolutely predict whether a complex will be useful in the present invention or not. There are a number of other factors which will influence this determination. One such factor is the effect of the monomer on the complex. It is also known that if the Weller equation produces too negative a value, deviations from the equation are possible. Furthermore, the Weller equation only predicts electron transfer, it does not predict whether a particular dye complex is an efficient initiator of polymerization. The equation is a useful first approximation.

Specific examples of cationic dye-borate anion complexes useful in the present invention are shown in the examples with their $\lambda$ max.

The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxpentacrylate (DPHPA), hexanediol-1,6-dimethacrylate, and diethyleneglycol dimethacrylate.

The cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight.

While the cationic dye-borate anion complex can be used alone as the initiator, film speeds tend to be quite low and oxygen inhibition is observed. It has been found that it is preferable to use the, complex in combination with an autooxidizer. An autooxidizer is a compound which is capable of consuming oxygen in a free radical chain process.

Representative examples of N,N-dialkylanilines useful in the present invention are 4-cyano-N, N-dimethylaniline, 4-acetyl-N,N-dimethylaniline, 4-bromo-N,N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, etc. Preferred N,N-dialkylanilines are 2,6-diisopropyl-N,N-dimethylaniline, 2,6-diethyl-N,N-dimethylaniline, N,N,2,4,6-pentamethylaniline (PMA) and p-t-butyl-N,N-dimethylaniline.

The autooxidizers are preferably used in the present invention in concentrations of about 4–5% by weight.

Thiols and disulfides also appear to enhance film speed although the mechanism is not clear. Particularly preferred thiols are selected from the group consisting of mercaptobenzoxazoles, mercaptotetrazines, mercaptotriazines and mercaptobenzothiazoles. Representative examples include 2-mercaptobenzothiazole, 6-ethoxy-2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzenethiol, 1-phenyl-1H-tetrazole-5-thiol, 4-phenyl-4H-1,2,4-triazole-3-thiol, 2-mercaptobenzimidazole, pentaerythritol tetrakis (mercaptoacetate), pentaerythritol tetrakis (3-mercaptoproprionate), trimethylolpropane tris(mercaptoacetate), 4-acetamidothiophenol, mercaptosuccinic acid, dodecanethiol, 2-mercaptopyridine, 4-mercaptopyridine, 2-mercapto-3H-quinazoline, and 2-mercaptothiazoline. Dissulfides as described in U.S. application Ser. No. 321,257 are also useful.

The photohardenable compositions of the present invention may be used in a wide variety of applications. They may be used to prepare photocurable resists, photoadhesives, photocurable coatings, photocurable inks, etc. They may also be microencapsulated and used in the full color panchromatic imaging system described in U.S. Pat. No. 4,772,541. A preferred method for microencapsulating the composition is described in U.S. application Ser. No. 128,292 filed Dec. 3, 1987. A preferred developer material is described in U.S. application No. 073,036 filed July 14, 1987.

Neopentylborates can be made by the reaction of neopentylmagnesium chloride with triphenylboron. sec-Butylborate can be made by the reaction of sec-butyllithium with triphenylboron. The resulting borate is metastisized with an appropriate dye.

The invention is illustrated in more detail in the examples below using the following compounds.

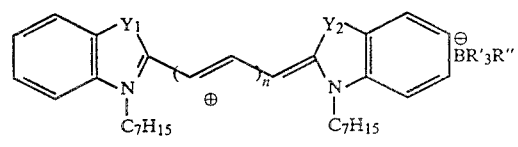

| | n | $Y_1$ | $Y_2$ | R' | R" | $\lambda$max |
|---|---|---|---|---|---|---|
| Compound 1 | 1 | $\diagdown C(CH_3)_2 \diagup$ | $\diagdown C(CH_3)_2 \diagup$ | $C_6H_5$ | Sec-$C_4H_9$ | 550 |

-continued

| | n | $Y_1$ | $Y_2$ | R' | R'' | λmax |
|---|---|---|---|---|---|---|
| Compound 2 | 2 | ∖C(CH₃)₂∕ | ∖C(CH₃)₂∕ | $C_6H_5$ | Sec-$C_4H_9$ | 650 |
| Compound 3 | 0 | S | ∖C(CH₃)₂∕ | $C_6H_5$ | Sec-$C_4H_9$ | 436 |
| Compound 4 | 1 | ∖C(CH₃)₂∕ | ∖C(CH₃)₂∕ | $C_6H_5$ | neopentyl | 550 |
| Compound 5 | 2 | ∖C(CH₃)₂∕ | ∖C(CH₃)₂∕ | $C_6H_5$ | neopentyl | 650 |
| Compound A (comparison) | 1 | ∖C(CH₃)₂∕ | ∖C(CH₃)₂∕ | $C_6H_5$ | n-$C_4H_9$ | 550 |
| Compound B (comparison) | 2 | ∖C(CH₃)₂∕ | ∖C(CH₃)₂∕ | $C_6H_5$ | n-$C_4H_9$ | 650 |
| Compound C | 0 | S | ∖C(CH₃)₂∕ | $C_6H_5$ | n-$C_4H_9$ | |

EXAMPLE 1

To compare the photographic characteristics of dye complexes in accordance with the present invention and previous dye complexes, dye complexes in accordance with the present invention and comparative complexes were encapsulated with photopolymerizable compositions.

The encapsulated compositions were coated on a sheet of ALPET in an amount of 6 g/cm² using a slot head coater and dried.

The coated compositions were exposed through a 30 step wedge. The results are shown in Table 1.

TABLE 1

| Dye Complex | Dmax | Dmin | Log 10% sens. | Log 90% sens. | DR* | Gamma |
|---|---|---|---|---|---|---|
| Green light exposure | | | | | | |
| A | 2.81 | 0.07 | 3.13 | 2.83 | 0.30 | 7.29 |
| 1 | 2.81 | 0.08 | 2.93 | 2.53 | 0.40 | 7.30 |
| Red light exposure | | | | | | |
| B | 2.80 | 0.09 | 3.75 | 3.25 | 0.50 | 4.34 |
| 2 | 2.70 | 0.07 | 3.43 | 3.00 | 0.43 | 4.81 |
| White light exposure | | | | | | |
| C | 1.98 | 0.13 | 3.30 | 2.96 | 0.34 | 5.27 |
| 3 | 2.08 | 0.10 | 3.22 | 2.91 | 0.31 | 4.11 |

*DR = Dynamic Range

The data clearly shows an increase in speed of three steps in shoulder speed and two step in toe speed for magenta media using sec-butylborate photoinitiator. These results also show a potential increase in the shoulder speed of cyan media utilizing sec-butylborate of nearly three steps and an increase in the toe of one step over current n-butylborate based media. Thus, sterically hindered borates do tend to lead to faster photoinitiators.

Example 2 illustrates a photosensitive material in accordance with the present invention.

EXAMPLE 2

A. The following oily internal phase compositions were prepared and preheated to 60° C.

| Internal Phase A (436 nm) | |
|---|---|
| TMPTA | 150 g |
| Compound 3 | 1.71 g |
| DIDMA | 1.50 g |
| Reakt Yellow Color Precursor (BASF) | 18 g |
| Desmodur N-100 (biuret of hexamethylene diisocyanate (Mobay Chemical Co.) | 10 g |
| Internal Phase B (550 nm) | |
| TMPTA | 150 g |
| Compound 1 | 0.66 g |
| DIDMA | 1.50 g |
| Magenta Color Precursor (Hilton-Davis Chemical Co.) | 36 g |
| Desmodur N-100 | 10 g |
| Internal Phase C (650 nm) | |
| TMPTA | 150 g |
| 2,6 diisopropylaniline | 6.0 g |
| Cyan color precursor (CP-177) (Hilton-Davis Chemical Co.) | 18 g |
| Compound 2 | 1.20 g |

B. The continuous phase for emulsification was prepared as follows and preheated to 60° C:
430 g H₂O 8.0 g Versa TL—dissolved for 15 minutes or more 12.65 g Pectin—dry blended with sodium bicarbonate and dissolved into water phase 0.24 g NaHCO$_3$—dry blended with pectin and added concurrently pH—adjusted by dropwise addition of acid and/or to pH 6.0

C. External continuous phase is brought to 3,000 rpm.

D. The internal phase material was added into a mixing continuous phase.

E. 3,000 rpm mixing maintained for 15 minutes after oil phase addition.

F. 246 g melamine-formaldehyde precondensate is added to emulsion with mixing at 1,500 rpm.

G. pH is adjusted to pH 6.0.

H. Reaction mixture is covered and held at 70° C. for 1 hour while mixing.

I. 46.2 g Urea @ 50% solution is added to reaction mixture and the reaction is allowed to continue at 70° C. for another 40 min. (This step scavenges unreacted formaldehyde.)

J. The pH is adjusted to about 9.5 with NaOH (20% solution), covered and allowed to cool while mixing gently.

The process is repeated for each internal phase composition to prepare three batches of microcapsules. Once prepared, the microcapsules are blended in an amount which provides good color balance, coated on a sheet of aluminized polyethylene terephthalate, and dried to provide a visible light sensitive, panchromatic photosensitive material.

Having described the invention in detail and by reference to preferred embodiments thereof, it will be apparent that modifications and variation are possible without departing from the scope of the invention defined in the appended claims:

What is claimed is:

1. A photohardenable composition which comprises a free radical polymerizable compound and a photoinitiator of the formula (I):

$$\begin{array}{c} R^1 \diagdown \diagup R^4 \\ B^- \quad D^+ \\ R^2 \diagup \diagdown R^3 \end{array} \quad (I)$$

where D$^+$ is a cationic dye moiety; R$^1$ is a branched chain secondary alkyl group; and R$^2$, R$^3$ and R$^4$ are aryl groups.

2. The photohardenable composition of claim 1 wherein said photoinitiator is represented by the formula (II):

(structure of formula II)

where Y$^1$ and Y$^2$ are an oxygen atom, a sulfur atom, a selenium atom, a vinyl group, >C(CH$_3$)$_2$, or >N—R$^7$ and may be the same or different; n is 0, 1, 2, or 3; z is 1 to 4; R$^1$ is a branched chain secondary alkyl group; R$^2$–R$^4$ are aryl groups; R$^7$ is a short chain alkyl group; R$^5$ and R$^6$ represent alkyl groups; and X is a hydrogen atom, an electron withdrawing group or an electron donating group.

3. The photohardenable composition of claim 2 wherein R$^1$ is a branched chain secondary alkyl group and R$^2$, R$^3$ and R$^4$ represent phenyl groups.

4. The photohardenable composition of claim 3 wherein R$^1$ is sec-butyl.

5. A photosensitive material comprising a support having a layer of photohardenable composition on the surface thereof, said composition comprising a free radical addition polymerizable compound and a photoinitiator represented by the formula (I):

$$\begin{array}{c} R^1 \diagdown \diagup R^4 \\ B^- \quad D^+ \\ R^2 \diagup \diagdown R^3 \end{array} \quad (I)$$

where D$^+$ is a cationic dye moiety; R$^1$ is a branched chain secondary alkyl group; and R$^2$, R$^3$ and R$^4$ are aryl groups.

6. The photosensitive material of claim 5 wherein said photoinitiator is represented by the formula (II):

(structure of formula II)

where Y$^1$ and Y$^2$ are the same or different and represent an oxygen atom, a sulfur atom, a selecium atom, a vinyl group, >C(CH$_3$)$_2$, or >N—R$^7$; n is 0, 1, 2, or 3; z is 1 to 4; R$^1$ is a branched chain secondary alkyl group; R$^2$, R$^3$ and R$^4$ are aryl groups; R$^7$ is a short chain alkyl group; R$^5$ and R$^6$ represent alkyl groups; and X is a hydrogen atom, an electron withdrawing group or an electron donating group.

7. The photosensitive material of claim 6 wherein R$^1$ is a branched chain secondary alkyl group and R$^2$, R$^3$ and R$^4$ represent phenyl groups.

8. The photosensitive material of claim 5 wherein said photohardenable composition is microencapsulated.

9. The photosensitive material of claim 7 wherein R$^1$ is sec-butyl.

* * * * *